United States Patent
Tousain

(10) Patent No.: US 7,170,581 B2
(45) Date of Patent: Jan. 30, 2007

(54) SELF-ADAPTING FEEDFORWARD CONTROL TUNING FOR MOTION SYSTEM, AND LITHOGRAPHIC APPARATUS PROVIDED WITH SUCH A MOTION SYSTEM

(75) Inventor: Rob Tousain, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 223 days.

(21) Appl. No.: 10/973,980

(22) Filed: Oct. 27, 2004

(65) Prior Publication Data
US 2006/0087632 A1    Apr. 27, 2006

(51) Int. Cl.
G03B 27/32    (2006.01)
G03B 27/42    (2006.01)
G03B 27/58    (2006.01)
G03B 27/62    (2006.01)

(52) U.S. Cl. .................... 355/53; 355/72; 355/75; 355/77

(58) Field of Classification Search .................. 355/53, 355/72, 75, 77
See application file for complete search history.

(56) References Cited

U.S. PATENT DOCUMENTS 6,686,716 B1 *  2/2004  Predina et al. ............. 318/560
6,949,844 B2 *  9/2005  Cahill et al. ................ 310/12
7,057,705 B2 *  6/2006  Heintze ...................... 355/53
2005/0043834 A1 *  2/2005  Rotariu et al. .............. 700/95
2005/0231706 A1 * 10/2005  Yang et al. .................. 355/72

\* cited by examiner

*Primary Examiner*—Rodney Fuller
(74) *Attorney, Agent, or Firm*—Pillsbury Winthrop Shaw Pittman, LLP

(57) ABSTRACT

A motion control system is presented. In an embodiment of the invention, the motion control system compares a motion profile setpoint generator configured to generate a set of profile setpoint signals including a position profile setpoint signal and additional profile setpoint signals. The feedforward controller generates a feedforward signal by summing the additional profile setpoint signals, the additional profile setpoint signals being multiplied by a respective coefficient. The motion control system is configured to (a) select an initial setting of the respective coefficients, (b) cause the motion profile setpoint generator to generate a set of profile setpoint signals so as to execute a motion profile, (c) measure an error between the position profile and an output position signal, and (d) update the respective coefficients by adding a product of the error and a respective learning gain thereto. In an implementation, standard motion controllers can be used.

19 Claims, 5 Drawing Sheets

SELF-ADAPTING FEEDFORWARD CONTROL TUNING FOR MOTION SYSTEM, AND LITHOGRAPHIC APPARATUS PROVIDED WITH SUCH A MOTION SYSTEM

FIELD

The present invention relates to a lithographic apparatus and more particularly to a lithographic apparatus provided with a motion system.

BACKGROUND

In many consumer products and manufacturing machines, high-precision motion systems may be embedded. Examples of consumer products with high-precision motion systems are hard disk drives, optical drives, and tape drives. Examples of manufacturing machines with high-precision motion systems are scanning lithography stages, and pick and place robots.

A typical controller for a high-precision motion system consists of a feedback controller and a feedforward controller. The feedforward controller uses the knowledge on the positioning setpoint to generate a feedforward command in such a way that the open loop response (with the feedback controller inactive) of the motion system resembles the setpoint as closely as possible. Different types of feedforward control can be distinguished. In the next paragraphs, two methods are discussed in more detail: Low-order Feedforward Control and Iterative Learning Control.

Low-order feedforward control (LFC) is well known and widely spread in industry. A low-order feedforward controller often includes different parts. A first part may be related to the setpoint acceleration, to generate the part of the command that is inertia-related. A second part may be related to the setpoint velocity, to generate the part of the command that is damping-related or friction-related. In the most advanced implementations, a third part may be related to the setpoint snap (identical to the derivative of jerk), to generate the part of the command that is related to the elastic deformation of the motion system. Advantages of LFC are its simplicity, its ease of implementation, and its flexibility against variations in the motion profile to be realized. A disadvantage of LFC is the required effort and time spent in manually tuning the coefficients of the different feedforward parts. Another disadvantage of LFC is the fact that the feedforward controller may not adapt to variations, in particular slow variations, in the motion system, in which case the performance will degrade.

Iterative Learning Control (ILC) is a methodology, which updates the control signal for a repeating task iteratively in such a way that the difference between the desired and the actual behavior of the system-to-be-controlled vanishes. ILC has been successfully applied in several applications. However, the main strength of ILC is also its main weakness: for repeating tasks, excellent feedforward signals can be designed, whereas these feedforward signals are useless for motion profiles with different characteristics, such as maximum displacement, velocity, acceleration. Thus, ILC may be inflexible, or, in the best case, only partially flexible for different motion profiles. Another disadvantage of ILC is that it usually needs rather extensive on-line computing and the storage and update of lengthy feedforward tables. An advantage of ILC is its ability to adapt to slow variations in the motion system, for example to changes in the inertia of the system or in motor constants.

An example of an apparatus including several high-precision motion systems is a lithographic apparatus, which is described hereinafter.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, high-precision motion systems may be found for performing the stepping and scanning operations.

SUMMARY

Embodiments of the invention include a motion control system enabling the automation of feedforward tuning.

According to an embodiment of the invention, a motion control system includes a motion profile setpoint generator for generating a set of profile setpoint signals including a position profile setpoint signal and additional profile setpoint signals; a feedforward controller for generating a feedforward signal by summing the additional profile setpoint signals, the additional profile setpoint signals being multiplied by a respective coefficient; the motion control system being configured to: (a) select an initial setting of the respective coefficients; (b) cause the motion profile setpoint generator to generate a set of profile setpoint signals so as to execute a motion profile; (c) measure an error between the position profile and an output position signal; (d) update the respective coefficients by adding a product of the error and a respective learning gain thereto.

According to an embodiment of the invention, a method for feedforward motion control includes generating a set of profile setpoint signals including a position profile setpoint signal and additional profile setpoint signals; generating a feedforward signal by summing the additional profile setpoint signals, the additional profile setpoint signals being multiplied by a respective coefficient; and determining the coefficients by: (a) selecting an initial setting of the respective coefficients; (b) generating a set of profile setpoint signals so as to execute a motion profile; (c) measuring an error between the position profile and an output position signal; (d) updating the respective coefficients by adding a product of the error and a respective learning gain thereto.

According to an embodiment of the invention, a lithographic apparatus is provided, the lithographic apparatus being arranged to transfer a pattern from a patterning device onto a substrate, wherein at least one of the patterning device and the substrate is positioned with a positioner which is controlled by a motion control system, the motion control system including a motion profile setpoint generator for generating a set of profile setpoint signals including a position profile setpoint signal and additional profile setpoint signals; a feedforward controller for generating a feedforward signal by summing the additional profile setpoint signals, the additional profile setpoint signals being multiplied by a respective coefficient; the motion control system being configured to: (a) select an initial setting of the respective coefficients; (b) cause the motion profile setpoint generator to generate a set of profile setpoint signals so as to execute a motion profile; (c) measure an error between the position profile and an output position signal; (d) update the respective coefficients by adding a product of the error and a respective learning gain thereto.

The invention provides for updating the coefficients of a low-order feedforward controller iteratively such that the difference between the desired and the actual behavior of the motion system is compensated.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
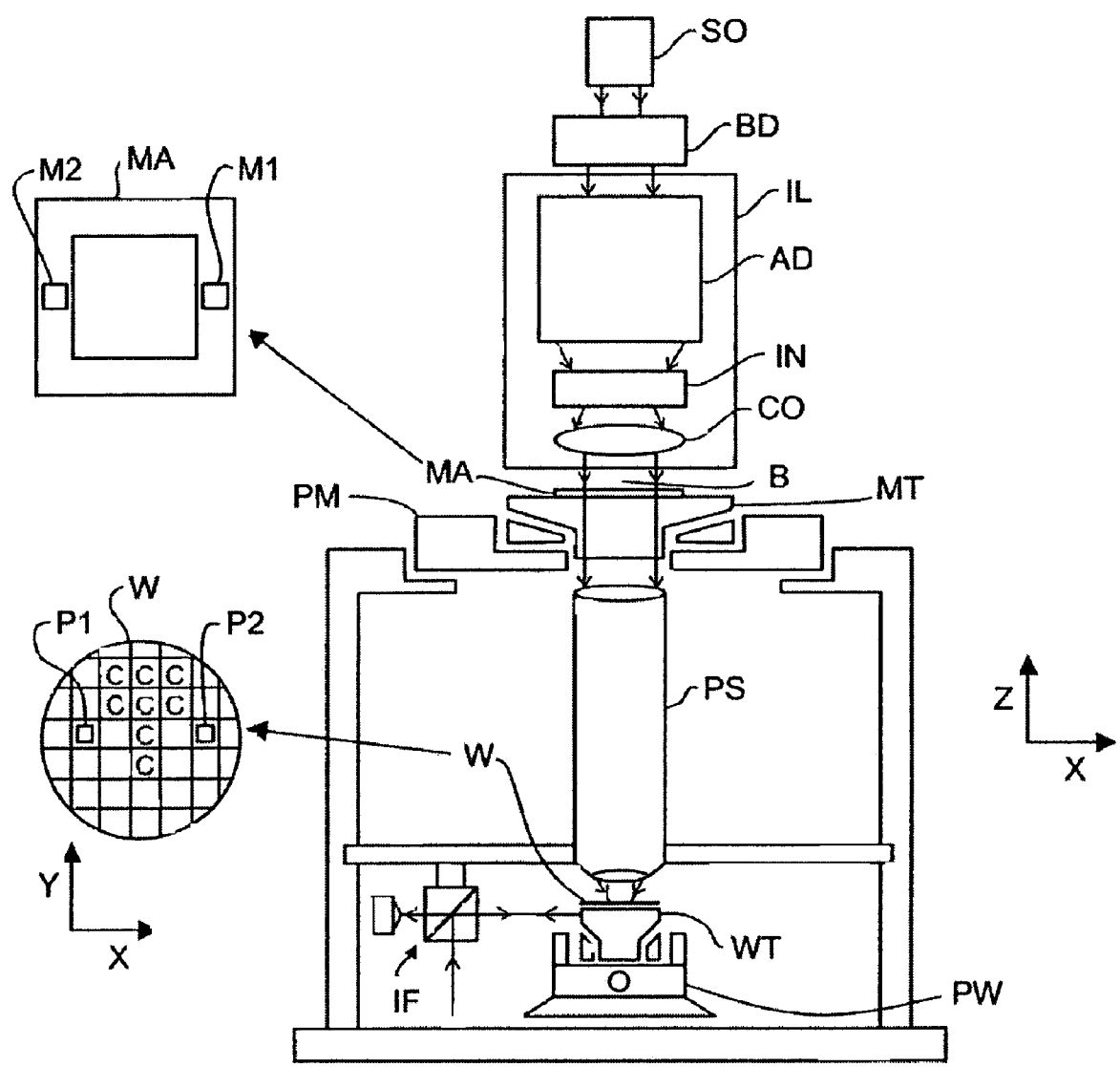
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other type of suitable radiation) and a support structure (e.g. a mask table) MT constructed to support a patterning device (e.g. a mask) MA and connected to a first positioner PM configured to accurately position the patterning device in accordance with certain parameters. The apparatus also includes a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The first positioner PM, the second positioner PW, and any other positioner included in the apparatus each may include a motion control system according to the invention. Such a motion control system will be explained in more detail below.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if needed, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

Step mode: the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

Scan mode: the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

Another mode: the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a motion control system according to an embodiment of the invention, coefficients of a low-order feedforward controller are updated iteratively in such a way that the difference between the desired and the actual behavior of the system to be controlled ceases. The update mechanism is based on theory underlying the update mechanism used in the so-called lifted ILC framework, the main difference being that ILC updates the individual samples of a feedforward signal, whereas according to an embodiment of the invention the coefficients of a feedforward controller are updated. Hence, these coefficients may be tuned, after which the resulting feedforward controller can be applied to arbitrary motion profiles. Convergence proofs known from ILC theory can be used to prove the convergence of the update mechanism. Thus, a very useful combination of the industrially accepted LFC method (acceleration, velocity) and the powerful ILC method is made.

Figure 2:
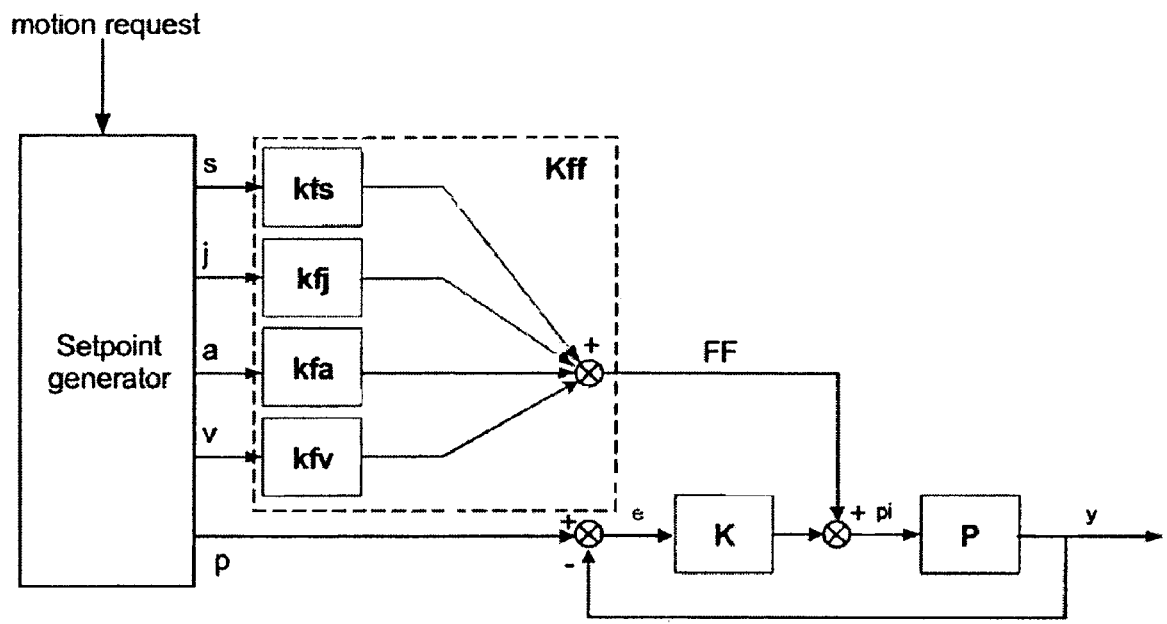
FIG. 2 shows a block diagram of a motion control system according to an embodiment of the invention.

FIG. 2 shows a block diagram of a motion system with feedback and feedforward control. s is the snap of the setpoint (derivative of jerk), j the jerk, a the acceleration, v the velocity and p the position. e is the servo error, pi the plant input, y the plant output. FF is the total feedforward signal, consisting of a part that is equal to the sum of the snap times kfs, the jerk times kfj, the acceleration times kfa and the velocity times kfv. In many industrial applications, the snap and the jerk are not accessible for feedforward control, but for the present invention the snap and the jerk are included to present a more general situation. It is observed, however, that in an even more generalized situation also other profile setpoint signals may be defined, which have a defined relationship with the position signal. As an example, dry Coulomb friction may be mentioned, having a constant feedforward signal value with a sign which is equal to the sign of the velocity.

Taking into consideration snap, jerk, acceleration and velocity, the following iterative procedure for updating the feedforward coefficients may be used in an embodiment of the invention:

Start with an initial setting for kfs, kfj, kfa, and kfv, denoted as $kfs^0$, $kfj^0$, $kfa^0$, and $kfv^0$, respectively. Set iteration counter k=1.

Execute a motion profile, measure the error $e^k \in \Re^{N^k \times 1}$, where $N^k$=number of samples in the motion profile used in iteration k.

Update the coefficients of the feedforward controller according to the following update law:

$$\begin{bmatrix} kfs^{k+1} \\ kfj^{k+1} \\ kfa^{k+1} \\ kfv^{k+1} \end{bmatrix} = \begin{bmatrix} kfs^k \\ kfj^k \\ kfa^k \\ kfv^k \end{bmatrix} + L^k e^k \quad (1)$$

where $L^k \in \Re^{4 \times N^k}$ is the learning gain. Set k=k+1 and go back to the second step.

More generally, this can be written as:

$$\begin{bmatrix} k1^{k+1} \\ k2^{k+1} \\ \vdots \\ kn^{k+1} \end{bmatrix} = \begin{bmatrix} k1^k \\ k2^k \\ \vdots \\ kn^k \end{bmatrix} + L^k e^k$$

where:
$k1^k \ldots kn^k$ are respective coefficients, in a $k^{th}$ iteration, of n setpoint profile signals,
$k1^{k+1} \ldots kn^{k+1}$ are respective coefficients, in a $(k+1)^{th}$ iteration, of n setpoint profile signals,
$L^k \in \Re^{m \times N^k}$ is the learning gain in a $k^{th}$ iteration,
$N^k$ is a number of samples in the motion profile used in a $k^{th}$ iteration, and
$e^k$ is the error in a $k^{th}$ iteration.

The iteration described above can be repeated continuously to adapt to slow changes in the system dynamics. If these are not expected, the iterative procedure can be stopped after a number of iterations. In this case, the method is used as a calibration.

One possible way out of several ways of determination of $L^k$ is described next. $L^k$ has to be updated every time a change is made in the motion profile. If the motion profile does not change at all or does not change during calibration, a fixed learning gain $L^k = L$ can be used, which can be computed off-line.

Let $FF^k \in \Re^{N^k}$ and $y^k \in \Re^{N^k}$ be the feedforward signal and measured output signal, respectively, in trial k. Let $PS^k \in \Re^{N^k \times N^k}$ be the map between FF and y. $PS^k$ is a Toeplitz matrix with the upper-diagonal triangular matrix equal to zero and the first column given by the impulse response coefficients of the process sensitivity (P/(1+PK)). Below, an example is given of how $PS^k$ would look for a motion system with impulse response coefficients [4,3,2,1] and $N^k$=4:

$$PS^k = \begin{bmatrix} 4 & 0 & 0 & 0 \\ 3 & 4 & 0 & 0 \\ 2 & 3 & 4 & 0 \\ 1 & 2 & 3 & 4 \end{bmatrix}$$

There are several ways to derive $PS^k$. One is to measure the impulse response of the system. Another is to use a simple model of the process sensitivity from which the impulse response coefficients are computed. The latter approach is used in the example described later.

The relation between a change in the feedforward parameters $kfs^k$, $kfj^k$, $kfa^k$, and $kfv^k$ and the corresponding change of the servo error in trial k $\Delta e^k$ is then given by the following expression:

$$\Delta e^k = -PS^k [s^k \quad j^k \quad a^k \quad v^k] \begin{bmatrix} \Delta kfs^k \\ \Delta kfj^k \\ \Delta kfa^k \\ \Delta kfv^k \end{bmatrix} \quad (2)$$

In each trial an update of the feedforward coefficients is computed such that the sum of squares of the error signal is minimized. Minimizing $(e^k + \Delta e^k)^T (e^k + \Delta e^k)$, with $\Delta e^k$ given by (2) leads to the following update law:

$$\begin{bmatrix} \Delta kfs^k \\ \Delta kfj^k \\ \Delta kfa^k \\ \Delta kfv^k \end{bmatrix} = \quad (3)$$

$$([s^k \quad j^k \quad a^k \quad v^k]^T PS^{k^T} PS^k [s^k \quad j^k \quad a^k \quad v^k])^{-1} [s^k \quad j^k \quad a^k \quad v^k]^T PS^{k^T} e^k$$

Based on (3), the learning gain in (1) is defined as follows:

$$L^k = \alpha ([s^k j^k a^k v^k]^T PS^{k^T} PS^k [s^k j^k a^k v^k])^{-1} [s^k j^k a^k v^k]^T PS^{k^T} \quad (4)$$

where $\alpha$ is a learning factor which can be used to balance the convergence speed against the insensitivity to non-repeating phenomena such as for example noise.

More generally, the learning gain $L^k$ may be defined as:

$$L^k = \alpha ([m1^k m2^k \ldots mn^k]^T PS^{k^T} PS^k [m1^k m2^k \ldots mn^k])^{-1} [m1^k m2^k \ldots mn^k]^T PS^{k^T}$$

where:
$\alpha$ is a learning factor,
$m1^k \ldots mn^k$ are n respective additional profile setpoint signals in a $k^{th}$ iteration, $PS^k$ is a map between the feedforward signal and the output position signal in a $k^{th}$ iteration, and $^T$ denotes a transposition.

Next, the convergence of the iteration is considered in more detail.

Given a set of measured impulse responses and a design of the learning gain $L^k$, convergence of the iteration procedure can be easily investigated by checking the eigen values of a 4 by 4 matrix. Consider the update relationship (1). Let the map between the feedforward signal and the output for the real system be given by $PS^{*k}$. Then, (1) can be rewritten as follows:

$$\begin{bmatrix} kfs^{k+1} \\ kfj^{k+1} \\ kfa^{k+1} \\ kfv^{k+1} \end{bmatrix} = \begin{bmatrix} kfs^k \\ kfj^k \\ kfa^k \\ kfv^k \end{bmatrix} + L^k \left( p^k - PS^{*k} [s^k \ j^k \ a^k \ v^k] \begin{bmatrix} kfs^k \\ kfj^k \\ kfa^k \\ kfv^k \end{bmatrix} \right) \quad (5)$$

$$= [I - L^k PS^{*k} [s^k \ j^k \ a^k \ v^k]] \begin{bmatrix} kfs^k \\ kfj^k \\ kfa^k \\ kfv^k \end{bmatrix} + L^k p^k$$

Equation (5) presents a linear, dynamic system with states $kfs^k$, $kfj^k$, $kfa^k$, and $kfv^k$. From linear systems theory, it is well known that this system is stable, and hence will converge to a fixed solution, if the eigen values of the state transition matrix $[I-L^k PS^{*k}[s^k j^k a^k v^k]]$ are inside the unit circle.

If $PS^{*k}=PS^k$ (which is the case if the impulse response of the real system is equal to the one that has been used in the design of $L^k$), then from substituting (4) in (5), we find that:

$$\begin{bmatrix} kfs^{k+1} \\ kfj^{k+1} \\ kfa^{k+1} \\ kfv^{k+1} \end{bmatrix} = [I - \alpha I] \begin{bmatrix} kfs^k \\ kfj^k \\ kfa^k \\ kfv^k \end{bmatrix} + L^k p^k \quad (6)$$

such that the eigen values of the state transition matrix are equal to $\alpha$. Convergence is then guaranteed if $0<\alpha<2$.

In the most accurate position control systems, a delay compensation may be present which matches the timing of the feedforward signal with the delay in the position measurement. This delay can have subsample values. A motion system in accordance with an embodiment of the invention may easily incorporate the self-tuning of or adaptation to unknown measurement delays. The basic idea is to model the feedforward controller as a linear combination of the snap, jerk, acceleration and velocity signals and time-shifted versions of those.

Figure 3:
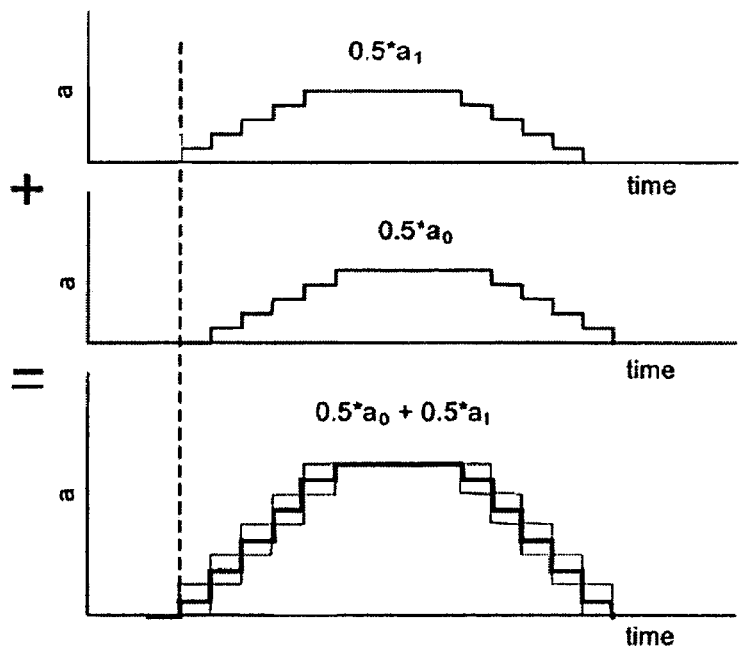
FIG. 3 shows three plots of an acceleration signal as a function of time.

An example of the use of delay compensation for an acceleration signal is given in FIG. 3. In this example, the acceleration signal is 'shifted back over half a sample'. The original acceleration signal is denoted $a_0$. $a_1$ is the same acceleration signal, however shifted back over 1 sample. The 0.5 sample shifted acceleration signal is constructed by adding half the original acceleration signal $a_0$ (second plot of FIG. 3) to half the shifted back acceleration signal $a_1$ (first plot of FIG. 3). The resulting acceleration signal is shown in the third plot of FIG. 3.

If the sub-sample delay correction is implemented to all four components in a typical feedforward signal, then the feedforward signal can be constructed as follows:

$$FF = [s_0^k \ s_1^k \ j_0^k \ j_1^k \ a_0^k \ a_1^k \ v_0^k \ v_1^k] \begin{bmatrix} kfs_0^k \\ kfs_1^k \\ kfj_0^k \\ kfj_1^k \\ kfa_0^k \\ kfa_1^k \\ kfv_0^k \\ kfv_1^k \end{bmatrix} \quad (7)$$

In the example shown in FIG. 3, both $kfa_0^k$ and $kfa_1^k$ are equal to 0.5.

The eight coefficients of the feedforward controller in (7) can be updated using an update relationship similar to (1). The derivation of this update relationship is omitted. After convergence, an estimate of the compensated delay can be obtained as follows:

$$\tau = \frac{kfa_1^k}{kfa_0^k + kfa_1^k} \quad (8)$$

The effectiveness of the automated delay compensation tuning is illustrated by the following example.

Figure 4:
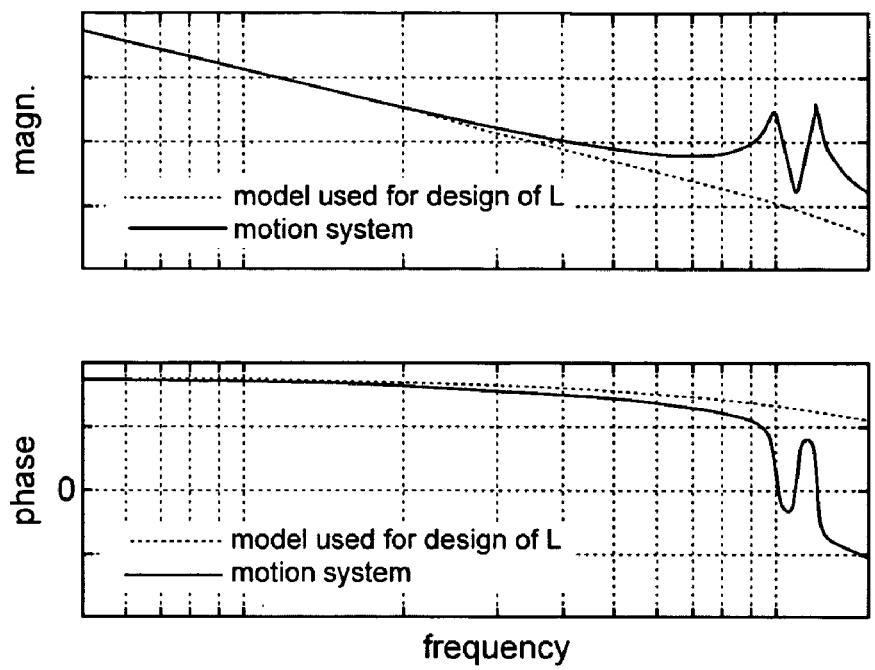
FIG. 4 shows a frequency response function (magnitude and phase, respectively, as a function of frequency) of the motion control system in accordance with an embodiment of the invention, as well as a model thereof.

As an example, the application of this technique to the feedforward tuning for a high precision motion system with actuator flexibility is considered. The frequency response function of the motion system is plotted in FIG. 4. To illustrate the robustness of the method, the design of the learning gain L is based on a very simple, rigid body model of the motion system, of which the frequency response is shown in FIG. 4 also.

Figure 5:
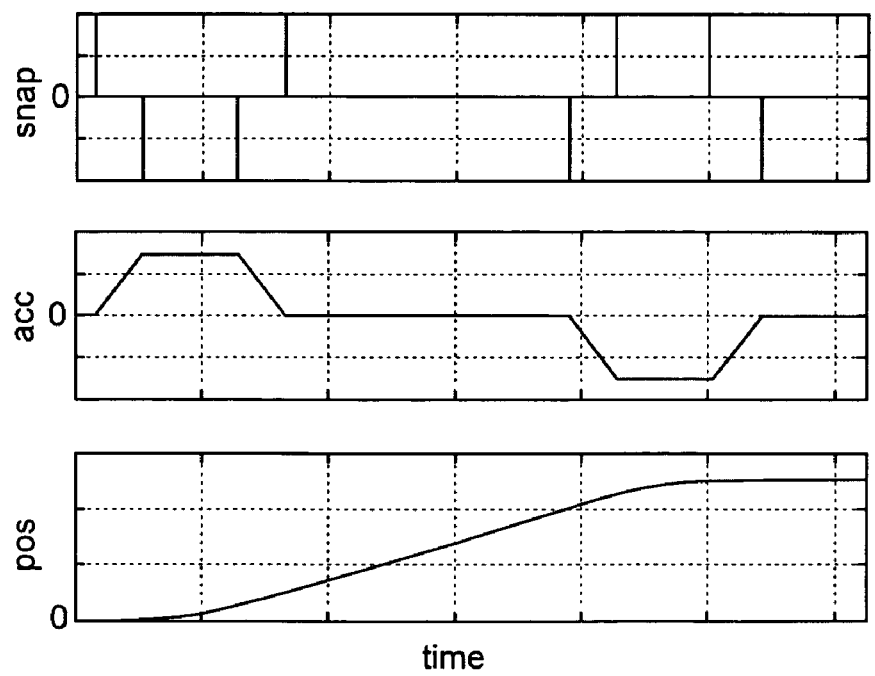
FIG. 5 shows timing charts of a setpoint snap, acceleration, and position, respectively, as a function of time, for the system of FIG. 4.

The feedforward controller to be designed consists of a combination of acceleration and snap feedforward. The measurement delay is approximately 1 quarter of a sample (the sample time being $\frac{1}{4000}$ s)) and has to be estimated also. The setpoint snap, acceleration and position are plotted in FIG. 5. Here, the invention is applied as a tuning procedure, with a fixed update gain L.

First, for simplicity, the measurement delay is neglected. In this case, the feedforward controller is given as follows:

$$FF^k = [s^k \ a^k] \begin{bmatrix} kfs^k \\ kfa^k \end{bmatrix}$$

Figure 6:
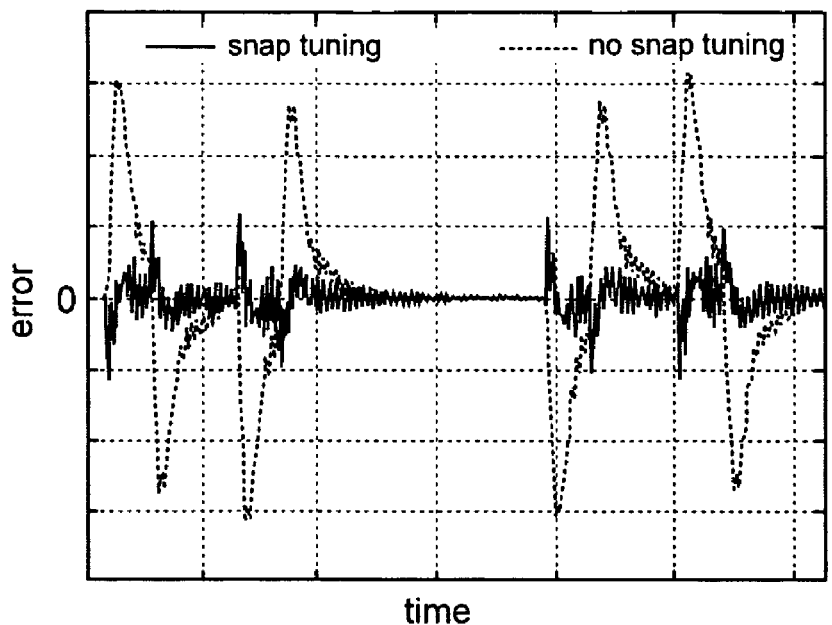
FIG. 6 shows a timing chart of a motion control error, with (solid line) and without (broken line) snap tuning, in the absence of a measurement delay.
Figure 7:
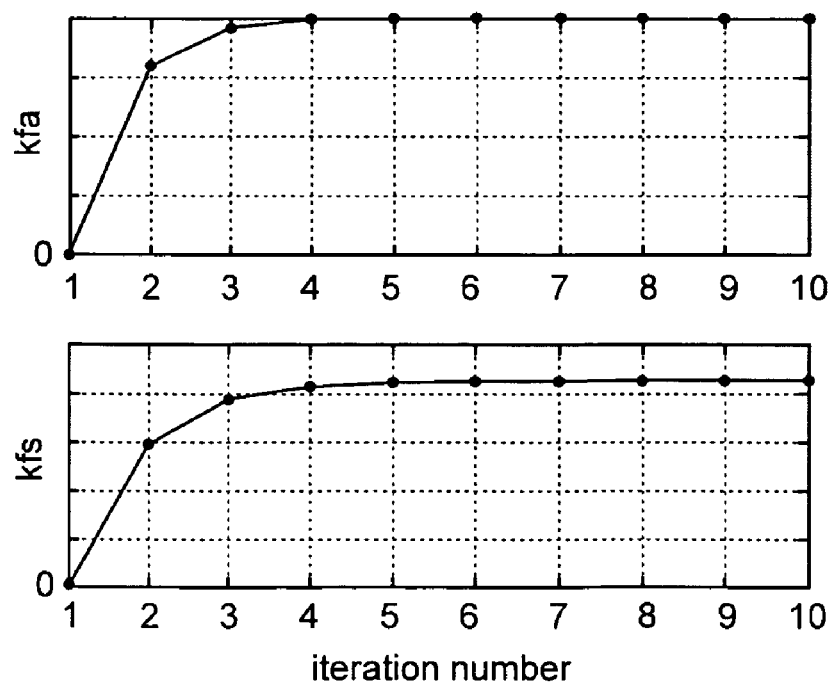
FIG. 7 illustrates a convergence over several iterations of an acceleration coefficient kfa and a snap coefficient kfs, respectively, in the absence of a measurement delay.

$kfs^k$ and $kfa^k$ are updated by means of update gain L which is designed using (5) with a learning factor $\alpha=0.8$. The tuning process is initiated using $kfs^0=0$ and $kfa^0=0$. Ten iterations are executed. The resulting errors after 10 iterations are plotted in FIG. 6. The error which results if the snap feedforward is omitted, is also plotted (dotted line). The evolution of $kfs^k$ and $kfa^k$ over the ten iterations is plotted in FIG. 7. Apparently, the feedforward parameters are optimally tuned, despite the mismatch between the motion system dynamics and the very simple model underlying the design of L.

Figure 8:
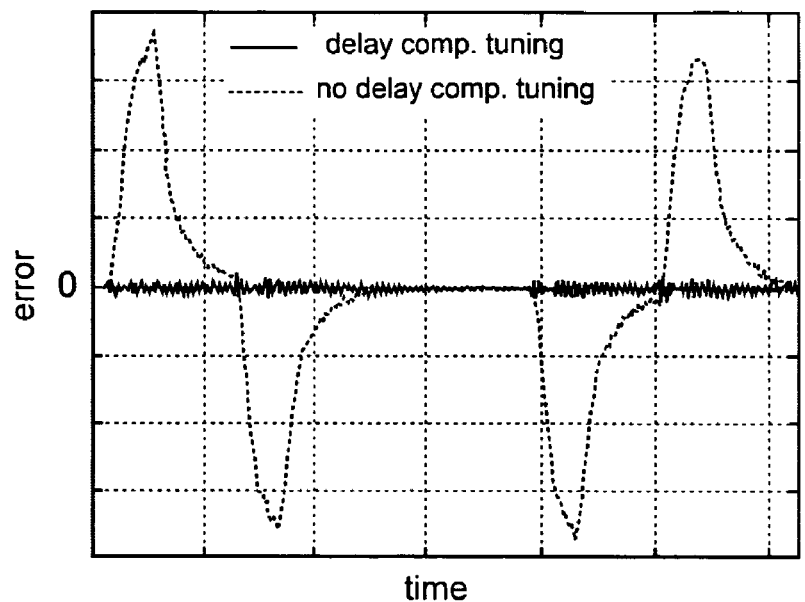
FIG. 8 shows a timing chart of a motion control error, with (solid line) and without (broken line) delay compensation tuning, in the presence of a measurement delay.

If the measurement delay has to be taken into account, a feedforward controller can be used as follows:

$$FF^k = [s_0^k \quad s_1^k \quad a_0^k \quad a_1^k] \begin{bmatrix} kfs_0^k \\ kfs_1^k \\ kfa_0^k \\ kfa_1^k \end{bmatrix}$$

where $s_0$ and $a_0$ are the original snap and acceleration profile, respectively, and where $s_1$ and $a_1$ are the snap and acceleration profile shifted back one sample in time. The resulting error is shown in FIG. 8. To demonstrate the effect of the delay compensation tuning, the converged error without delay compensation tuning is included in FIG. 8 as well (dotted line).

Figure 9:
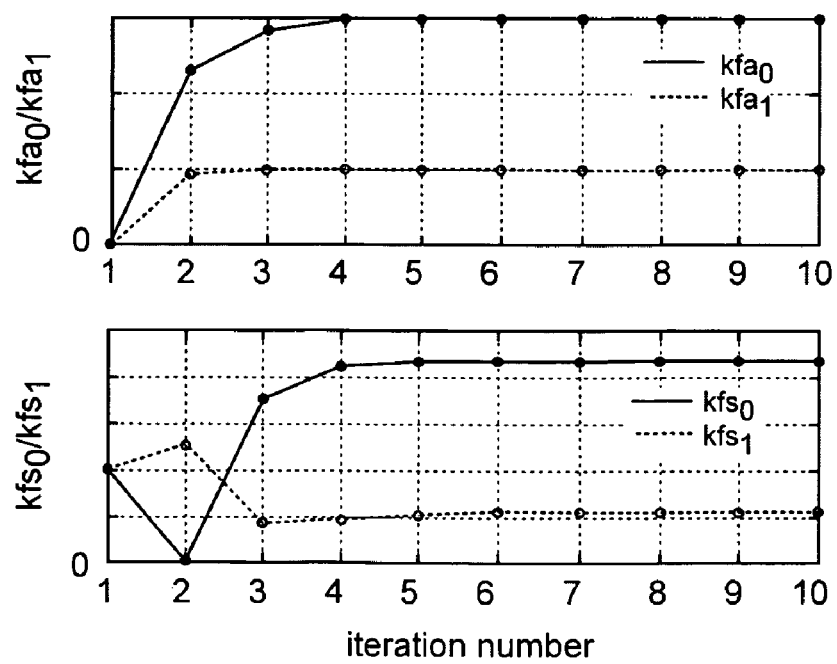
FIG. 9 illustrates a convergence over several iterations of acceleration coefficients ratio $kfa_0/kfa_1$ and snap coefficients ratio $kfs_0/kfs_1$, respectively, in the presence of a measurement delay.

The corresponding evolution of the feedforward coefficients $kfa_0^k$, $kfa_1^k$, $kfs_0^k$, and $kfs_1^k$ is shown in FIG. 9. The effect of the measurement delay is now properly accounted for by the values of $kfa_0^k$ and $kfa_1^k$. Note that after convergence $kfa_0^k$ is three times larger than $kfa_1^k$. This complies, according to equation (8), with a delay compensation of one quarter of a sample, which is indeed equal to the measurement delay.

The real-time computational demand of the method according to the invention is very limited. At most $4N^k$ multiplications and $4N^k$ summations have to be performed each trial for a complete update of the feedforward coefficients. These computations can be spread out over $N^k$ samples. If the computations are implemented recursively, for every sample only 4 multiplications and 4 summations have to be carried out.

Embodiments of the invention enable the automation of feedforward tuning for motion control systems. The method can easily be implemented in combination with existing motion control software and eliminates the manual tuning step.

The invention can be applied in lithography stages, PCB assembly robots, the seek control systems of optical drives, hard disk drives, and many other motion control systems which have to perform setpoint tracking.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A motion control system, comprising:
a motion profile setpoint generator configured to generate a set of profile setpoint signals including a position profile setpoint signal and additional profile setpoint signals, and
a feedforward controller configured to generate a feedforward signal by summing the additional profile setpoint signals, said additional profile setpoint signals being multiplied by a respective coefficient;
wherein the motion control system is configured to:
(a) select an initial setting of the respective coefficients;
(b) cause the motion profile setpoint generator to generate a set of profile setpoint signals so as to execute a motion profile;
(c) measure an error between the position profile and an output position signal; and
(d) update the respective coefficients by adding a product of the error and a respective learning gain thereto.

2. The motion control system of claim 1, wherein said additional profile setpoint signals comprise first and higher order derivatives of the position profile setpoint signal.

3. The motion control system of claim 1, wherein the motion control system is configured to perform a sequence (b)-(c)-(d) k times, where k is a positive integer.

4. The motion control system of claim 1, wherein the respective coefficients are updated according to the formula:

$$\begin{bmatrix} k1^{k+1} \\ k2^{k+1} \\ \vdots \\ kn^{k+1} \end{bmatrix} = \begin{bmatrix} k1^k \\ k2^k \\ \vdots \\ kn^k \end{bmatrix} + L^k e^k$$

where:

$k1^k \ldots kn^k$ are respective coefficients, in a $k^{th}$ iteration, of n setpoint profile signals, $k1^{k+1} \ldots kn^{k+1}$ are respective coefficients, in a $(k+1)^{th}$ iteration, of n setpoint profile signals, $L^k \in \mathfrak{R}^{n \times N^k}$ is the learning gain in a $k^{th}$ iteration, $N^k$ is a number of samples in the motion profile used in a $k^{th}$ iteration, and $e^k$ is the error in a $k^{th}$ iteration.

5. The motion control system of claim 4, wherein the learning gain $L^k$ is defined as:

$$L^k = \alpha([m1^k m2^k \ldots mn^k]^T PS^{k^T} PS^k [m1^k m2^k \ldots mn^k])^{-1} [m1^k m2^k \ldots mn^k]^T PS^{k^T}$$

where:

α is a learning factor, $m1^k \ldots mn^k$ are n respective additional profile setpoint signals in a $k^{th}$ iteration, $PS^k$ is a map between the feedforward signal and the output position signal in a $k^{th}$ iteration, and $^T$ denotes a transposition.

6. The motion control system of claim 5, wherein the additional profile setpoint signals are selected from a group of signals consisting of snap, jerk, acceleration and velocity.

7. The motion control system of claim 5, wherein 0<α<2.

8. The motion control system of claim 1, wherein the respective coefficients are updated so as to minimize the sum of squares of the errors.

9. The motion control system of claim 1, wherein a first of the additional profile setpoint signals is shifted in time.

10. The motion control system of claim 9, wherein a duplicate of an original signal of the additional profile setpoint signals is generated, said duplicate being shifted in time relative to said original signal, and wherein a time-shifted additional profile setpoint signal is added to the set of profile setpoint signals.

11. The motion control system of claim 1, wherein the motion profile setpoint generator is adapted to generate a position profile setpoint signal, a velocity profile setpoint signal, an acceleration profile setpoint signal, a jerk profile setpoint signal, and a snap profile setpoint signal.

12. A method for feedforward motion control, comprising:

generating a set of profile setpoint signals including a position profile setpoint signal and additional profile setpoint signals;

generating a feedforward signal by summing the additional profile setpoint signals, said additional profile setpoint signals being multiplied by a respective coefficient, and determining the respective coefficients by:

(a) selecting an initial setting of the respective coefficients;

(b) generating a set of profile setpoint signals so as to execute a motion profile;

(c) measuring an error between the position profile and an output position signal;

(d) updating the respective coefficients by adding a product of the error and a respective learning gain thereto.

13. The method of claim 12, wherein said additional profile setpoint signals comprise first and higher order derivatives of the position profile setpoint signal.

14. The method of claim 12, further comprising performing the generating of a set of profile setpoint signals, the measuring and the updating k times, wherein k is a positive integer.

15. The method of claim 12, wherein the respective coefficients are updated according to the formula:

$$\begin{bmatrix} k1^{k+1} \\ k2^{k+1} \\ \vdots \\ kn^{k+1} \end{bmatrix} = \begin{bmatrix} k1^k \\ k2^k \\ \vdots \\ kn^k \end{bmatrix} + L^k e^k$$

where:

$k1^k \ldots kn^k$ are respective coefficients, in a $k^{th}$ iteration, of n setpoint profile signals, $k1^{k+1} \ldots kn^{k+1}$ are respective coefficients, in a $(k+1)^{th}$ iteration, of n setpoint profile signals, $L^k \in \mathfrak{R}^{n \times N^k}$ is the learning gain in a $k^{th}$ iteration, $N^k$ is a number of samples in the motion profile used in a $k^{th}$ iteration, and $e^k$ is the error in a $k^{th}$ iteration.

16. The method of claim 15, wherein the learning gain $L^k$ is defined as:

$$L^k = \alpha([m1^k m2^k \ldots mn^k]^T PS^{k^T} PS^k [m1^k m2^k \ldots mn^k])^{-1} [m1^k m2^k \ldots mn^k]^T PS^{k^T}$$

where:

α is a learning factor, $m1^k \ldots mn^k$ are n respective additional profile setpoint signals in a $k^{th}$ iteration, $PS^k$ is a map between the feedforward signal and the output position signal in a $k^{th}$ iteration, and $^T$ denotes a transposition.

17. The method of claim 16, wherein the additional profile setpoint signals are selected from a group of signals consisting of snap, jerk, acceleration and velocity.

18. The method of control system of claim 16, wherein 0<α<2.

19. A lithographic apparatus arranged to transfer a pattern from a patterning device onto a substrate, the lithographic apparatus comprising:

a motion control system configured to control a positioner adapted to position the patterning device or the substrate, the motion control system comprising:

a motion profile setpoint generator configured to generate a set of profile setpoint signals including a position profile setpoint signal and additional profile setpoint signals, and a feedforward controller configured to generate a feedforward signal by summing the additional profile setpoint signals, said additional profile setpoint signals being multiplied by a respective coefficient;

wherein the motion control system is configured to:

(a) select an initial setting of the respective coefficients;

(b) cause the motion profile setpoint generator to generate a set of profile setpoint signals so as to execute a motion profile;
(c) measure an error between the position profile and an output position signal; and
(d) update the respective coefficients by adding a product of the error and a respective learning gain thereto.

* * * * *